United States Patent
Takemori

(10) Patent No.: US 10,729,009 B2
(45) Date of Patent: Jul. 28, 2020

(54) CERAMIC ELECTRONIC COMPONENT

(71) Applicant: Murata Manufacturing Co., Ltd., Nagaokakyo-shi, Kyoto-fu (JP)

(72) Inventor: Yuki Takemori, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 16 days.

(21) Appl. No.: 16/174,623

(22) Filed: Oct. 30, 2018

(65) Prior Publication Data
US 2019/0069402 A1 Feb. 28, 2019

Related U.S. Application Data

(63) Continuation of application No. PCT/JP2017/016377, filed on Apr. 25, 2017.

(30) Foreign Application Priority Data

May 16, 2016 (JP) ................. 2016-098041

(51) Int. Cl.
*H05K 1/11* (2006.01)
*H05K 1/03* (2006.01)
(Continued)

(52) U.S. Cl.
CPC ........... *H05K 1/0306* (2013.01); *H05K 1/113* (2013.01); *H05K 3/285* (2013.01); *H05K 3/34* (2013.01); *H05K 3/4644* (2013.01); *H05K 3/244* (2013.01); *H05K 2201/017* (2013.01); *H05K 2201/0195* (2013.01); *H05K 2201/0347* (2013.01); *H05K 2201/099* (2013.01);
(Continued)

(58) Field of Classification Search
CPC ......... H05K 2201/09436; H05K 2201/09481; H05K 2201/099; H05K 2201/0347; H05K 1/111; H05K 1/112; H05K 1/113
See application file for complete search history.

(56) References Cited

U.S. PATENT DOCUMENTS 3,465,435 A * 9/1969 Steranko .............. H05K 3/4007
29/843
4,067,104 A * 1/1978 Tracy .................. H01L 25/0657
29/854
(Continued)

FOREIGN PATENT DOCUMENTS

DE 102010005465 A1 * 8/2010 ............. H01L 24/13
JP 2006173222 A * 6/2006 ............. H05K 3/421
(Continued)

OTHER PUBLICATIONS

International Search Report issued for PCT/JP2017/016377, dated Aug. 8, 2017.
(Continued)

*Primary Examiner* — Z. Jim Yang
(74) *Attorney, Agent, or Firm* — Arent Fox LLP

(57) ABSTRACT

A ceramic electronic component that includes an electronic component body having a superficial base ceramic layer, a surface electrode on a surface of the electronic component body, and a covering ceramic layer covering a peripheral section of the surface electrode. The peripheral section of the surface electrode that is covered by the covering ceramic layer has an opening or a thin portion.

14 Claims, 5 Drawing Sheets

(51) Int. Cl.
*H05K 3/28* (2006.01)
*H05K 3/34* (2006.01)
*H05K 3/46* (2006.01)
*H05K 3/24* (2006.01)

(52) U.S. Cl.
CPC .............. *H05K 2201/09436* (2013.01); *H05K 2201/09481* (2013.01); *H05K 2203/1131* (2013.01); *Y10T 428/12201* (2015.01)

(56) References Cited

U.S. PATENT DOCUMENTS

| | | | | |
|---|---|---|---|---|
| 5,175,609 A | * | 12/1992 | DiGiacomo | H01L 21/4853 257/766 |
| 5,203,078 A | * | 4/1993 | Nakanishi | G06K 19/077 228/5.1 |
| 5,227,812 A | * | 7/1993 | Watanabe | B41J 2/14129 174/261 |
| 5,436,411 A | * | 7/1995 | Pasch | H01L 23/5384 174/250 |
| 5,869,887 A | * | 2/1999 | Urushima | H01L 23/16 257/684 |
| 2001/0026888 A1 | * | 10/2001 | Yokoyama | H01M 2/1066 429/121 |
| 2003/0096493 A1 | * | 5/2003 | Vandermeulen | H01L 23/49816 438/612 |
| 2005/0000728 A1 | * | 1/2005 | Tanaka | H05K 1/167 174/260 |
| 2005/0205293 A1 | * | 9/2005 | Yamada | H01L 23/13 174/255 |
| 2006/0169484 A1 | * | 8/2006 | Yamashita | H01L 23/49816 174/250 |
| 2006/0220246 A1 | * | 10/2006 | Kim | H01L 23/49816 257/738 |
| 2006/0255102 A1 | * | 11/2006 | Snyder | H01L 23/498 228/203 |
| 2007/0080449 A1 | * | 4/2007 | Kurita | H01L 23/49866 257/734 |
| 2007/0093058 A1 | * | 4/2007 | Ohtsuki | H05K 3/243 438/687 |
| 2007/0108619 A1 | * | 5/2007 | Hsu | H05K 1/116 257/762 |
| 2007/0161223 A1 | * | 7/2007 | Hu | H05K 3/243 438/613 |
| 2007/0224400 A1 | * | 9/2007 | Meguro | H01L 21/4807 428/209 |
| 2008/0157359 A1 | * | 7/2008 | Yokobayashi | H01L 23/49816 257/737 |
| 2008/0157389 A1 | * | 7/2008 | Park | H05K 1/111 257/773 |
| 2008/0176035 A1 | * | 7/2008 | Shih | H05K 3/243 428/131 |
| 2010/0208437 A1 | * | 8/2010 | Maeda | H01L 21/4857 361/760 |
| 2011/0048782 A1 | * | 3/2011 | Hsu | H05K 1/111 174/261 |
| 2011/0079926 A1 | * | 4/2011 | Chung | H01L 21/4853 257/778 |
| 2011/0108313 A1 | * | 5/2011 | Kung | H05K 3/062 174/261 |
| 2011/0108315 A1 | * | 5/2011 | Kung | H05K 3/4007 174/261 |
| 2012/0055702 A1 | * | 3/2012 | Rathburn | H01L 23/4985 174/254 |
| 2012/0276401 A1 | * | 11/2012 | Nakayama | H01L 23/15 428/596 |
| 2013/0003332 A1 | * | 1/2013 | Lee | H05K 1/09 361/760 |
| 2013/0330509 A1 | | 12/2013 | Otsubo | |
| 2014/0000946 A1 | * | 1/2014 | Hosoi | H05K 1/115 174/257 |
| 2014/0332258 A1 | * | 11/2014 | Uchida | H05K 3/4069 174/254 |
| 2014/0363927 A1 | * | 12/2014 | Hurwitz | H05K 1/0298 438/125 |
| 2015/0000966 A1 | * | 1/2015 | Jo | H05K 1/092 174/257 |
| 2015/0264809 A1 | * | 9/2015 | Aoyama | H05K 1/111 257/773 |
| 2015/0357277 A1 | * | 12/2015 | Nagai | H01L 23/49838 174/255 |
| 2016/0005683 A1 | * | 1/2016 | Liu | H05K 1/111 174/257 |
| 2016/0014892 A1 | * | 1/2016 | Nakamura | C04B 35/62218 174/258 |
| 2016/0088737 A1 | * | 3/2016 | Iijima | H01L 24/19 361/748 |
| 2016/0316558 A1 | * | 10/2016 | Sakai | H05K 1/11 |
| 2016/0351525 A1 | * | 12/2016 | Chun | H01L 24/49 |
| 2017/0013710 A1 | * | 1/2017 | Wang | H05K 1/09 |
| 2017/0118846 A1 | * | 4/2017 | Yamada | G01R 1/0466 |
| 2017/0170282 A1 | * | 6/2017 | Zechmann | H01L 21/76879 |
| 2017/0280560 A1 | * | 9/2017 | Park | H05K 1/113 |
| 2017/0325330 A1 | * | 11/2017 | Wang | H05K 1/0242 |
| 2018/0019220 A1 | * | 1/2018 | Ryu | H01L 23/4985 |
| 2018/0042110 A1 | * | 2/2018 | Cok | H01L 24/02 |
| 2019/0350088 A1 | * | 11/2019 | Matejat | H05K 3/244 |

FOREIGN PATENT DOCUMENTS

| | | | |
|---|---|---|---|
| JP | 2008109062 A | | 5/2008 |
| JP | 2011176188 A | * | 9/2011 |
| JP | 2012186269 A | | 9/2012 |
| JP | 2016207961 A | * | 12/2016 ............ H05K 1/111 |
| WO | 2007063692 A1 | | 6/2007 |
| WO | WO-2011047544 A1 | * | 4/2011 ........... H05K 3/4007 |
| WO | 2012121141 A1 | | 9/2012 |

OTHER PUBLICATIONS

Written Opinion of the International Searching Authority issued for PCT/JP2017/016377, dated Aug. 8, 2017.

* cited by examiner

CERAMIC ELECTRONIC COMPONENT

CROSS REFERENCE TO RELATED APPLICATIONS

The present application is a continuation of International application No. PCT/JP2017/016377, filed Apr. 25, 2017, which claims priority to Japanese Patent Application No. 2016-098041, filed May 16, 2016, the entire contents of each of which are incorporated herein by reference.

FIELD OF THE INVENTION

The present invention relates to a ceramic electronic component.

BACKGROUND OF THE INVENTION

For example, a multilayer ceramic electronic component such as a multilayer ceramic substrate is cited as a ceramic electronic component including an electronic component body and a surface electrode placed on a surface thereof.

In such a ceramic electronic component, in order to prevent the deterioration of high-frequency characteristics of a surface electrode, a covering ceramic layer, i.e., a framing layer, is placed on a peripheral section of the surface electrode (refer to Patent Document 1).

Patent Document 1: Japanese Unexamined Patent Application Publication No. 2012-186269

SUMMARY OF THE INVENTION

This covering ceramic layer is placed on a ceramic layer (hereinafter referred to as the base ceramic layer) of an electronic component body in addition to the peripheral section of the surface electrode.

Usually, the covering ceramic layer is formed in such a manner that a ceramic green sheet for forming the covering ceramic layer is put on a predetermined place and is fired or ceramic paste for forming the covering ceramic layer is applied to a predetermined place and is fired. The covering ceramic layer is preferably formed by firing together with firing for obtaining the electronic component body and the surface electrode.

However, there has been a problem in that a difference in strength is caused in a covering ceramic layer obtained after firing because the sinterability of a ceramic green sheet or a ceramic paste is different between on a surface electrode and on a base ceramic layer. In particular, the strength of the covering ceramic layer on the surface electrode is lower than the strength of the covering ceramic layer on the base ceramic layer. As a result, there has been a problem in that the covering ceramic layer is peeled from the surface electrode in the case where the ceramic electronic component is subjected to a surface treatment such as blasting.

The present invention has been made to solve the above problems. It is an object of the present invention to provide a ceramic electronic component in which the bond strength between a covering ceramic layer and a surface electrode is high and in which the covering ceramic layer can be prevented from being peeled from the surface electrode.

In the case where a covering ceramic layer is obtained by firing together with firing for obtaining an electronic component body and a surface electrode, it is conceivable that, during firing, a ceramic component or glass component contained in a base ceramic layer transforms into a liquid phase, which is supplied to the covering ceramic layer, and as a result, the sinterability of the covering ceramic layer is increased. The inventor has conceived that the difference in amount of the liquid phase supplied to the covering ceramic layer from the base ceramic layer causes the difference in sinterability of the covering ceramic layer between on the surface electrode and on the base ceramic layer. That is, the inventor has conceived that the covering ceramic layer on the surface electrode is unlikely to be supplied with the liquid phase and therefore has poorer sinterability as compared to the covering ceramic layer on the base ceramic layer and the bond strength between the covering ceramic layer and the surface electrode is low.

As a consequence, the inventor has found that a covering ceramic layer can be prevented from being peeled from a surface electrode in such a manner that a path for supplying a liquid phase from a base ceramic layer to the covering ceramic layer on the surface electrode is formed in the surface electrode, thereby completing the present invention.

A ceramic electronic component according to a first embodiment of the present invention includes an electronic component body including a superficial base ceramic layer, a surface electrode placed on a surface of the electronic component body, and a covering ceramic layer covering a peripheral section of the surface electrode. The peripheral section of the surface electrode that is covered by the covering ceramic layer has an opening therein.

In the first embodiment of the present invention, forming the opening in the peripheral section of the surface electrode that is covered by the covering ceramic layer allows a liquid phase to be supplied to the covering ceramic layer from the base ceramic layer through the opening. As a result, the sinterability of the covering ceramic layer on the surface electrode is increased and the bond strength between the covering ceramic layer and the surface electrode is increased. Therefore, even in the case where the ceramic electronic component is subjected to a surface treatment such as blasting, the covering ceramic layer is unlikely to be peeled from the surface electrode.

The liquid phase is supplied to the covering ceramic layer from the base ceramic layer through the opening as described above. Therefore, even when forming a covering ceramic layer having a composition with low sinterability (for example, a covering ceramic layer in which the content of a metal oxide such as $Al_2O_3$ is high), the bond strength between the covering ceramic layer and the surface electrode is high.

When the bond strength between the covering ceramic layer and the surface electrode is high, even in the case where a plating layer is formed after the covering ceramic layer is formed, a plating solution is unlikely to penetrate the interface between the surface electrode and the covering ceramic layer before the plating layer is formed and therefore the risk of anomalous deposition is low.

Furthermore, forming the opening in the peripheral section of the surface electrode increases the contact area between the covering ceramic layer and the surface electrode, therefore enhancing an anchoring effect, and increasing the bond strength between the covering ceramic layer and the surface electrode.

In the first embodiment of the present invention, the opening preferably extends through the surface electrode.

Forming the opening in the peripheral section of the surface electrode such that the opening extends through the surface electrode facilitates the supply of the liquid phase to the covering ceramic layer on the surface electrode.

In the first embodiment of the present invention, the opening is preferably a hole or a slit.

The opening, which is the hole or the slit, can be readily formed by a method in which screen printing is performed using a screen mask having an opening, a working method using a laser or a mechanical puncher, or the like. Therefore, a path for supplying the liquid phase from the base ceramic layer to the covering ceramic layer on the surface electrode can be readily formed.

A ceramic electronic component according to a second embodiment of the present invention includes an electronic component body including a superficial base ceramic layer, a surface electrode on a surface of the electronic component body, and a covering ceramic layer covering a peripheral section of the surface electrode. The peripheral section of the surface electrode that is covered by the covering ceramic layer has a thin portion on the peripheral side of the surface electrode and which is thinner than a central section of the surface electrode. The width of the thin portion is 50% or more of the width of the peripheral section of the surface electrode that is covered by the covering ceramic layer.

A ceramic electronic component according to a third embodiment of the present invention includes an electronic component body including a superficial base ceramic layer, a surface electrode on a surface of the electronic component body, and a covering ceramic layer covering a peripheral section of the surface electrode. The peripheral section of the surface electrode that is covered by the covering ceramic layer has a thin portion on the central side of the surface electrode and which is thinner than a central section of the surface electrode. The width of the thin portion is 20% or more of the width of the peripheral section of the surface electrode that is covered by the covering ceramic layer.

In the second embodiment of the present invention, the thin portion, which is thinner than the central section of the surface electrode, allows a liquid phase to be supplied to the covering ceramic layer from the base ceramic layer through the thin portion. As a result, the sinterability of the covering ceramic layer on the surface electrode is increased and the bond strength between the covering ceramic layer and the surface electrode is increased. Therefore, even in the case where the ceramic electronic component is subjected to a surface treatment such as blasting, the covering ceramic layer is unlikely to be peeled from the surface electrode.

In the third embodiment of the present invention, the thin portion, which is thinner than the central section of the surface electrode, allows a liquid phase to be supplied to the covering ceramic layer from the base ceramic layer through the thin portion as is the case with the second embodiment. In particular, in the third embodiment, the liquid phase is supplied to an end portion of the covering ceramic layer that is most likely to be peeled off as compared to the second embodiment. As a result, the sinterability of the covering ceramic layer on the surface electrode is increased and the bond strength between the covering ceramic layer and the surface electrode is increased. Therefore, even in the case where the ceramic electronic component is subjected to a surface treatment such as blasting, the covering ceramic layer is unlikely to be peeled from the surface electrode.

In each of the second and third embodiments of the present invention, the liquid phase is likely to be supplied to the covering ceramic layer from the base ceramic layer through the thin portion as described above. Therefore, even in the case of forming a covering ceramic layer having a composition with low sinterability (for example, a covering ceramic layer in which the content of a metal oxide such as $Al_2O_3$ is high), the bond strength between the covering ceramic layer and the surface electrode is high.

When the bond strength between the covering ceramic layer and the surface electrode is high, even in the case where a plating layer is formed after the covering ceramic layer is formed, a plating solution is unlikely to penetrate the interface between the surface electrode and the covering ceramic layer before the plating layer is formed and therefore the risk of anomalous deposition is low.

In each of the second and third embodiments of the present invention, the width of the thin portion is preferably 15 μm or more and the thickness of the thin portion is preferably 10 μm or less.

Adjusting each of the width and thickness of the thin portion to the above range facilitates the supply of the liquid phase to the covering ceramic layer on the surface electrode.

The ceramic electronic component according to the first embodiment of the present invention, the ceramic electronic component according to the second embodiment of the present invention, and the ceramic electronic component according to the third embodiment of the present invention also have common shared features.

In the ceramic electronic component according to all embodiments of the present invention, the surface electrode preferably includes a first sintered layer placed on the upper surface of the base ceramic layer, a second sintered layer placed on the upper surface of the first sintered layer, and a plating layer placed on the upper surface of the second sintered layer.

This allows the surface electrode to have a multilayer structure composed of the first sintered layer, which is used to increase the bond strength to the base ceramic layer, and the second sintered layer, which is used to form the plating layer. Therefore, the bond strength between the surface electrode and the base ceramic layer can be increased.

In the ceramic electronic component according to all embodiments of the present invention, the first sintered layer preferably contains a metal oxide containing at least one metal element selected from Al, Zr, Ti, Si, and Mg.

When the first sintered layer contains the metal oxide, the metal oxide can be coupled with a ceramic component or glass component contained in the base ceramic layer. Therefore, the bond strength between the first sintered layer and the base ceramic layer can be increased.

In the ceramic electronic component according to all embodiments of the present invention, the second sintered layer preferably contains a smaller amount of the metal oxide as compared to the first sintered layer.

In this case, the upper surface of the second sintered layer can be kept in such a condition that a plating is likely to adhere.

According to all embodiments of the present invention, a ceramic electronic component in which the bond strength between a covering ceramic layer and a surface electrode is high and the covering ceramic layer can be prevented from being peeled from the surface electrode can be provided.

DETAILED DESCRIPTION OF THE PREFERRED EMBODIMENTS

An embodiment of a ceramic electronic component according to the present invention is described below. However, the present invention is not limited to the configurations below. Various modifications can be made without departing from the spirit of the present invention. Combinations of two or more of individual preferred configurations of the present invention that are described below are included in the scope of the present invention.

Embodiments below are illustrative and the partial replacement or combination of configurations described in different embodiments can be made. In a second embodiment and subsequent embodiments, items common to those described in a first embodiment are not described in detail but only items different from those described therein are described. In particular, similar effects due to similar configurations are not mentioned one by one in each embodiment.

In the embodiments below, an embodiment where a ceramic electronic component includes a multilayer ceramic substrate having a plurality of laminated ceramic layers is described. However, the present invention is not limited to such a multilayer ceramic electronic component and is applicable to various ceramic electronic components in which an electronic component body includes a superficial base ceramic layer and in which a surface electrode is placed on a surface of the electronic component body.

First Embodiment

Figure 1:
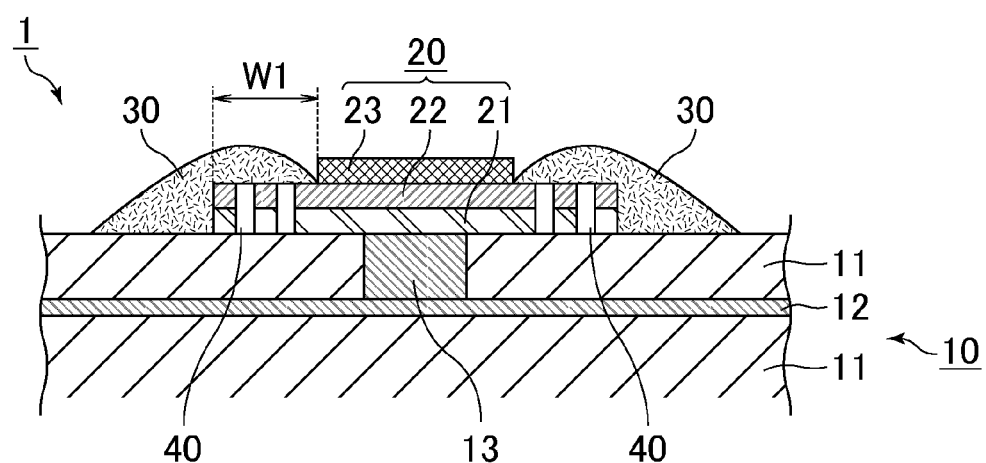
FIG. 1 is a schematic sectional view of an example of a ceramic electronic component according to a first embodiment of the present invention.

FIG. 1 is a schematic sectional view of an example of a ceramic electronic component according to the first embodiment of the present invention.

The ceramic electronic component 1, of which the overall configuration is not shown in FIG. 1, includes an electronic component body 10 including a superficial base ceramic layer 11, a surface electrode 20 placed on a surface of the electronic component body 10, and a covering ceramic layer 30 covering a peripheral section of the surface electrode 20. The peripheral section of the surface electrode 20 that is covered by the covering ceramic layer 30 has openings 40. The openings 40 are preferably filled with a ceramic component or glass component, which is not shown in FIG. 1, contained in the base ceramic layer 11.

Referring to FIG. 1, the electronic component body 10 has a multilayer structure composed of a plurality of laminated base ceramic layers 11 and an inner conductive film 12 and via-hole conductor 13 serving as inner wiring conductors are placed in the electronic component body 10. The inner conductive film 12 is electrically connected to the via-hole conductor 13. The via-hole conductor 13 is electrically connected to the surface electrode 20. The surface electrode 20 has a three-layer structure and includes a first sintered layer 21 placed on the upper surface of the base ceramic layer 11 located at a surface of the electronic component body 10, a second sintered layer 22 placed on the upper surface of the first sintered layer 21, and a plating layer 23 placed on the upper surface of the second sintered layer 22.

In this specification, a section of a surface electrode that is covered by a covering ceramic layer is referred to as a peripheral section of the surface electrode and a section of the surface electrode that is not covered by the covering ceramic layer is referred to as a central section of the surface electrode. The peripheral section of the surface electrode that is covered by the covering ceramic layer is hereinafter simply referred to as the peripheral section of the surface electrode.

Likewise, when the surface electrode has a multilayer structure, a section covered by the covering ceramic layer is referred to as a peripheral section of each layer and a section not covered by the covering ceramic layer is referred to as a central section of the layer.

As shown in FIG. 1, in the ceramic electronic component 1, the peripheral section of the surface electrode 20 is covered by the covering ceramic layer 30, which is placed on the base ceramic layer 11 and the second sintered layer 22, and has the openings 40. The openings 40 extend through the first sintered layer 21 and the second sintered layer 22. On the other hand, a central section of the surface electrode 20 is provided with the plating layer 23. The plating layer 23 is not covered by the covering ceramic layer 30.

The base ceramic layer, which is included in the electronic component body, preferably contains a low-temperature co-fired ceramic material. The low-temperature co-fired ceramic material refers to, among ceramic materials, a material which can be sintered at a firing temperature of 1,000° C. or less and which can be co-fired with Ag or Cu.

Examples of the low-temperature co-fired ceramic material, which is contained in the base ceramic layer, include glass composite low-temperature co-fired ceramic materials formed by mixing borosilicate glass with ceramic materials such as quartz, alumina, and forsterite; crystal glass low-temperature co-fired ceramic materials containing ZnO—MgO—$Al_2O_3$—$SiO_2$ crystal glass; and non-glass low-temperature co-fired ceramic materials formed using BaO—$Al_2O_3$—$SiO_2$ ceramic materials or $Al_2O_3$—CaO—$SiO_2$—MgO—$B_2O_3$ ceramic materials.

Inner wiring conductors (the inner conductive film and the via-hole conductor), which are placed in the electronic component body, contain a conductive component. Examples of the conductive component, which is contained in the inner wiring conductors, include Au, Ag, Cu, Pt, Ta, W, Ni, Fe, Cr, Mo, Ti, Pd, Ru, and alloys mainly containing one of these metals. The inner wiring conductors preferably contain Au, Ag, or Cu and more preferably Ag or Cu as a conductive component. Au, Ag, and Cu have low resistance and are therefore particularly suitable for the case where the ceramic electronic component is for use in high-frequency applications.

The covering ceramic layer, which covers the peripheral section of the surface electrode, is placed on the base ceramic layer located at the surface of the electronic component body and the surface electrode.

The covering ceramic layer preferably contains a low-temperature co-fired ceramic material. In this case, the low-temperature co-fired ceramic material contained in the covering ceramic layer may be the same as or different from the low-temperature co-fired ceramic material contained in the base ceramic layer and is preferably the same as the low-temperature co-fired ceramic material contained in the base ceramic layer.

The covering ceramic layer may contain the same metal oxide as a metal oxide which is contained in the first sintered layer of the surface electrode as described below and preferably contains substantially no metal oxide. When the covering ceramic layer contains the metal oxide, the content of the metal oxide in the covering ceramic layer is preferably less than 50% by weight.

The thickness of the covering ceramic layer is not particularly limited and is preferably 0.5 μm to 40 μm.

The surface electrode, which is placed on the surface of the electronic component body, is one connected to another electronic component such as a wiring board or a mounted component. The surface electrode is connected to the other electronic component by soldering or the like.

Examples of a conductive component contained in the surface electrode include Au, Ag, Cu, Pt, Ta, W, Ni, Fe, Cr, Mo, Ti, Pd, Ru, and alloys mainly containing one of these metals. The surface electrode preferably contains the same conductive component as that contained in the inner wiring conductors. In particular, the surface electrode preferably contains Au, Ag, or Cu and more preferably Ag or Cu as a conductive component.

The width (the length represented by W1 in FIG. 1) of the peripheral section of the surface electrode is not particularly limited and is preferably 15 μm to 1 mm.

In this specification, the width of the peripheral section of the surface electrode refers to the distance from the periphery of the surface electrode to the inner edge of the covering ceramic layer.

In the first embodiment of the present invention, the peripheral section of the surface electrode that is covered by the covering ceramic layer characteristically has the openings. The openings are preferably filled with the ceramic component or glass component contained in the base ceramic layer.

The peripheral section of the surface electrode may be provided with a single opening and is preferably provided with a plurality of openings.

The openings, which are placed in the peripheral section of the surface electrode, may extend through the surface electrode and may be open to a principal surface of the surface electrode without extending through the surface electrode. The openings preferably extend through the surface electrode. When the openings do not extend through the surface electrode, the distance from a principal surface of the surface electrode that has no openings to each opening is preferably 10 μm or less.

When the peripheral section of the surface electrode has a plurality of the openings, all of the openings preferably extend through the surface electrode and openings extending through the surface electrode and openings not extending through the surface electrode may be present in a mixed state.

A location where the openings are placed is not particularly limited and is preferably the peripheral section of the surface electrode. The openings are preferably uniformly placed in the peripheral section of the surface electrode.

The openings, which are placed in the peripheral section of the surface electrode, are preferably holes or slits.

The planar shape of the holes is preferably substantially circular or regularly polygonal and is more preferably substantially circular or square. The planar shape of the slits is preferably substantially oval or rectangular.

When the peripheral section of the surface electrode is provided with a hole or a slit, one or more holes only may be placed, one or more slits only may be placed, or holes and slits may be present in a mixed state. When the peripheral section of the surface electrode is provided with a plurality of holes, the holes may have different shapes and preferably have the same shape. This applied to slits.

The surface electrode may have a single-layer structure or a multilayer structure and preferably has the multilayer structure.

When the surface electrode has the single-layer structure, the surface electrode is preferably composed of a sintered layer only.

When the surface electrode has the multilayer structure, the multilayer structure is preferably an at least two-layer structure including a sintered layer placed on the upper surface of the base ceramic layer located at the surface of the electronic component body and a plating layer placed on the upper surface of the sintered layer and is more preferably an at least three-layer structure including a first sintered layer placed on the upper surface of the base ceramic layer located at the surface of the electronic component body, a second sintered layer placed on the upper surface of the first sintered layer, and a plating layer placed on the upper surface of the second sintered layer.

The sintered layers are those formed by baking conductive paste and the plating layers are those formed by electroplating or electroless plating after the sintered layers are formed.

When the surface electrode has the multilayer structure, the surface electrode preferably includes a plating layer located outermost and the surface electrode preferably includes a sintered layer only without including any plating layer. When the surface electrode includes the plating layer located outermost, the plating layer is usually formed after the sintered layers and the covering ceramic layer are formed. Therefore, the plating layer is not covered by the covering ceramic layer.

The first sintered layer, second sintered layer, and plating layer of the surface electrode are described below. The first sintered layer, which is included in the surface electrode, contains a conductive component. In order to increase the bond strength to the electronic component body, the first sintered layer preferably further contains a metal oxide.

Examples of the conductive component contained in the first sintered layer include Au, Ag, Cu, Pt, Ta, W, Ni, Fe, Cr, Mo, Ti, Pd, Ru, and alloys mainly containing one of these metals. The first sintered layer preferably contains the same conductive component as that contained in the inner wiring conductors. In particular, the first sintered layer preferably contains Au, Ag, or Cu and more preferably Ag or Cu as a conductive component.

The metal oxide contained in the first sintered layer is, for example, a metal oxide containing at least one metal element selected from the group consisting of Al, Zr, Ti, Si, and Mg. The metal oxide may be used alone or in combination with one or more metal oxides. Among these, a metal oxide containing at least one metal element selected from the group consisting of Al, Zr, and Ti is preferable and a metal oxide containing Al element is more preferable.

The content of the metal oxide in the first sintered layer is not particularly limited and is preferably higher than the content of the content of the metal oxide in the second sintered layer. In particular, the content of the metal oxide in the first sintered layer is preferably 1% by weight or more and more preferably 3% by weight or more. On the other hand, the content of the metal oxide in the first sintered layer is preferably less than 10% by weight and more preferably less than 5% by weight.

When the first sintered layer contains the metal oxide, particles of metal contained in the conductive component and particles of the metal oxide may be present in a dispersed state and surroundings of the metal particles may be covered by the metal oxide. The surroundings of the metal particles are preferably covered by the metal oxide. When the surroundings of the metal particles are covered by the metal oxide, the bond strength to the electronic component body can be increased even if the content of the metal oxide is low.

The planar shape of the first sintered layer is not particularly limited and is, for example, rectangular, tetragonal, polygonal rather than tetragonal, circular, or oval.

The second sintered layer, which is included in the surface electrode, contains a conductive component. The conductive component contained in the second sintered layer is preferably the same as the conductive component contained in the first sintered layer.

The second sintered layer may contain the same metal oxide as the metal oxide contained in the first sintered layer. When the content of the metal oxide therein is high, a plating is unlikely to adhere to the upper surface of the second sintered layer. Therefore, the second sintered layer preferably contains a smaller amount of the metal oxide as compared to the first sintered layer and more preferably contains substantially no metal oxide. In the case where the second sintered layer contains the metal oxide, the content of the metal oxide in the second sintered layer is preferably less than 1% by weight when the content of the metal oxide in the first sintered layer is 1% by weight to less than 10% by weight. When the content of the metal oxide in the first sintered layer is 3% by weight to less than 5% by weight, the content of the metal oxide in the second sintered layer is preferably less than 3% by weight and more preferably less than 1% by weight.

The area of the upper surface of the second sintered layer is preferably substantially the same as the area of the upper surface of the first sintered layer. That is, the planar shape of the second sintered layer is preferably substantially the same as the planar shape of the first sintered layer.

The number of sintered layers is not limited to two and another sintered layer may be placed between the first sintered layer, which is placed on the upper surface of the base ceramic layer, and the second sintered layer, of which the upper surface is overlaid with the plating layer.

The plating layer, which is included in the surface electrode, is preferably made of Au, Ag, Ni, Pd, Cu, Sn, or an alloy containing these metals. The plating layer, which is included in the surface electrode, may be a plating layer composed of a plurality of sublayers such as a nickel plating sublayer and gold plating sublayer that are the first sublayer and the second sublayer, respectively, from the second sintered layer side; a nickel plating sublayer and tin plating sublayer that are the first sublayer and the second sublayer, respectively, from the second sintered layer side; and a nickel plating sublayer, palladium plating sublayer, and gold plating sublayer that are the first sublayer, the second sublayer, and the third sublayer, respectively, from the second sintered layer side.

A section provided with the covering ceramic layer is provided with no plating layer. Therefore, the area of the upper surface of the plating layer is preferably less than the area of the upper surface of the second sintered layer.

The thickness of the plating layer is not particularly limited and is preferably 1 μm to 10 μm.

Figure 2A:
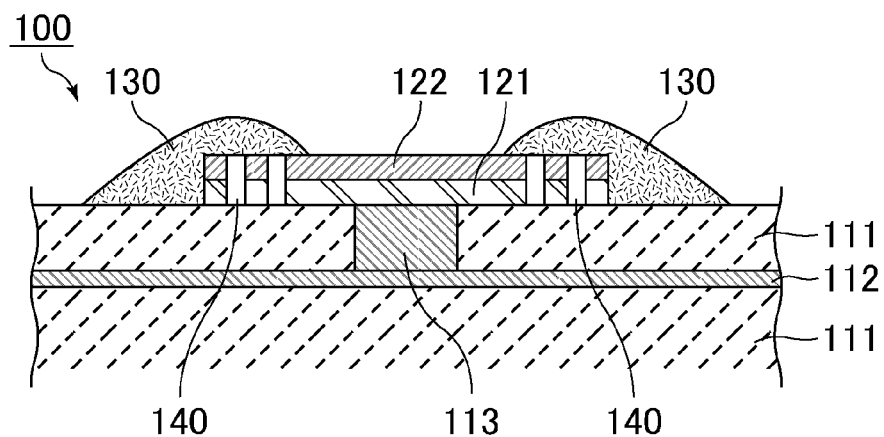
FIGS. 2A to 2C are schematic sectional views showing an example of a method for manufacturing the ceramic electronic component 1 shown in FIG. 1.
Figure 2B:
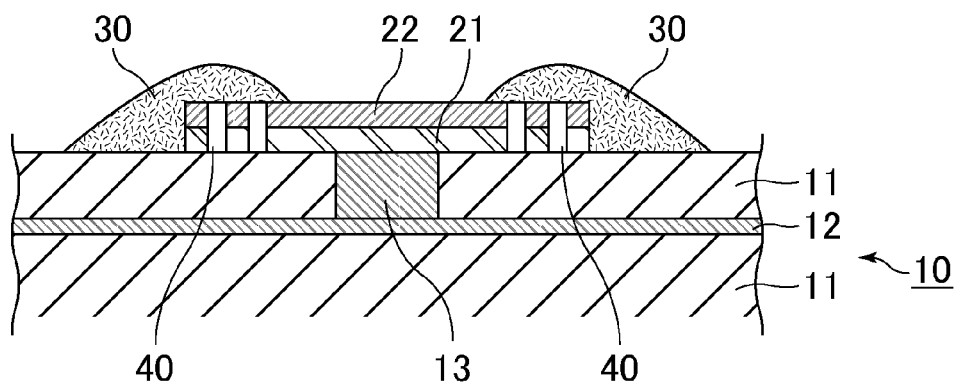
Figure 2C:
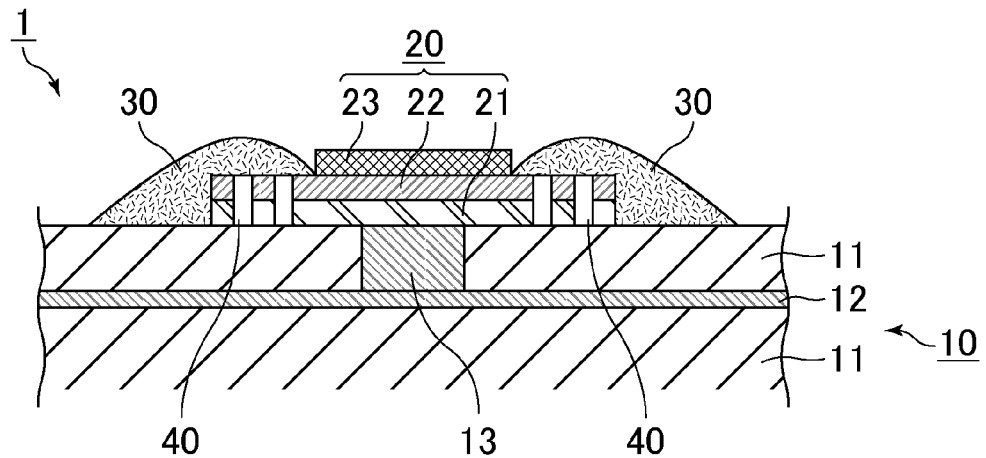

The ceramic electronic component 1 shown in FIG. 1 is preferably manufactured as described below. FIGS. 2A to 2C are schematic sectional views showing an example of a method for manufacturing the ceramic electronic component 1 shown in FIG. 1.

First, an unsintered multilayer body 100 is prepared as shown in FIG. 2A.

In order to prepare the unsintered multilayer body 100, a plurality of base ceramic green sheets 111 are prepared. The base ceramic green sheets 111 are those converted into the base ceramic layers 11 after firing.

The base ceramic green sheets are those obtained by forming, for example, slurry containing a powder of a ceramic raw material such as a low-temperature co-fired ceramic material, an organic binder, and a solvent into sheets by a doctor blade process or the like. The slurry may contain various additives such as a dispersant and a plasticizer.

The organic binder contained in the slurry may be, for example, a butyral resin (polyvinyl butyral), an acrylic resin, a methacrylic resin, or the like. The solvent may be, for example, toluene, an alcohol such as isopropyl alcohol, or the like. The plasticizer may be, for example, di-n-butyl phthalate or the like.

Next, a through-hole for forming the via-hole conductor 13 is formed in a specific one of the base ceramic green sheets 111. The through-hole is filled with a conductive paste containing, for example, Ag or Cu as a conductive component, whereby a conductive paste body 113 to be converted into the via-hole conductor 13 is formed.

A conductive paste film 112 to be converted into the inner conductive film 12 is formedC on a specific one of the base ceramic green sheets 111 by, for example, a process such as screen printing using a conductive paste having the same composition as that of the above conductive paste.

Furthermore, a conductive paste film 121 to be converted into the first sintered layer 21 is formed on the base ceramic green sheet 111 placed superficially after stacking. A conductive paste film 122 to be converted into the second sintered layer 22 is formed on the conductive paste film 121. The conductive paste film 121 to be converted into the first sintered layer 21 can be formed by a process such as screen printing using, for example, a conductive paste containing a conductive component such as Ag or Cu and a metal oxide such as $Al_2O_3$. The conductive paste film 122 to be converted into the second sintered layer 22 can be formed by a process such as screen printing using, for example, a conductive paste containing a conductive component such as Ag or Cu. In this operation, the conductive paste film 121 and the conductive paste film 122 are formed so as to have openings such that openings 140 are formed so as to extend through the conductive paste film 121 to be converted into the first sintered layer 21 and the conductive paste film 122 to be converted into the second sintered layer 22. Alternatively, after the conductive paste film 121 and the conductive paste film 122 are formed, the openings are formed therein. After the base ceramic green sheets 111 are stacked, the conductive paste film 121 to be converted into the first sintered layer 21 and the conductive paste film 122 to be converted into the second sintered layer 22 may be formed before firing. Examples of the metal oxide contained in the conductive paste include $Al_2O_3$, $ZrO_2$, $TiO_2$, $SiO_2$, and MgO. Among these oxides, $Al_2O_3$ is preferably used.

Examples of a method for forming the conductive paste films having the openings include a method in which screen printing is performed using a screen mask having openings and a method in which after a conductive paste film is formed on a transfer film such as a PET film and openings are formed in the conductive paste film on the transfer film using a mechanical puncher, the conductive paste film is transferred to a base ceramic green sheet. An example of a method for forming the openings after the formation of the conductive paste films is a method in which after a conductive paste film is formed on a base ceramic green sheet, openings are formed in the conductive paste film only using a laser or the like.

A covering ceramic green sheet 130 is separately prepared. The covering ceramic green sheet 130 is one converted into the covering ceramic layer 30 after firing.

The covering ceramic green sheet is one obtained by forming, for example, slurry containing a powder of a ceramic raw material such as a low-temperature co-fired ceramic material, an organic binder, and a solvent into a sheet by a doctor blade process or the like. The slurry may contain various additives such as a dispersant and a plasticizer. The slurry for preparing the covering ceramic green sheet may be the slurry for preparing the base ceramic green sheets.

Subsequently, the unsintered multilayer body 100 is prepared by stacking and then pressure-bonding the base ceramic green sheet 111 provided with the conductive paste body 113 to be converted into the via-hole conductor 13 or the conductive paste film 112 to be converted into the inner conductive film 12, the base ceramic green sheets 111 provided with the conductive paste film 121 to be converted into the first sintered layer 21 and the conductive paste film 122 to be converted into the second sintered layer 22, and the covering ceramic green sheet 130. The covering ceramic green sheet 130 is provided on the base ceramic green sheet 111 placed superficially after stacking and the conductive paste film 122 to be converted into the second sintered layer 22 so as to cover a region provided with the openings 140.

The unsintered multilayer body 100 can be prepared in such a manner that, instead of the covering ceramic green sheet 130, a paste-like composition is applied to the base ceramic green sheet 111 located at a surface of the unsintered multilayer body 100 and the conductive paste film 122 to be converted into the second sintered layer 22. In this case, the paste-like composition may be applied to the unstacked base ceramic green sheet 111 and the conductive paste film 122 to be converted into the second sintered layer 22.

Thereafter, the unsintered multilayer body 100 is fired. This allows the following body to be obtained as shown in FIG. 2B: a multilayer body including the electronic component body 10, which includes the base ceramic layer 11 placed superficially; the first sintered layer 21, which is placed on the upper surface of the base ceramic layer 11; the second sintered layer 22, which is placed on the upper surface of the first sintered layer 21; and the covering ceramic layer 30, which is placed on the base ceramic layer 11 and the second sintered layer 22. Peripheral sections of the first and second sintered layers 21 and 22 that are covered by the covering ceramic layer 30 are provided with the openings 40. The ceramic component or the glass component, which is contained in the base ceramic layer 11, transforms into a liquid phase, which is not shown in FIG. 2B, during firing. The liquid phase is supplied to the covering ceramic layer 30 (the covering ceramic green sheet 130) from the base ceramic layer 11 (the base ceramic green sheets 111) through the openings 40. Therefore, the openings 40 are preferably filled with the ceramic component or the glass component, which is contained in the base ceramic layer 11.

The first sintered layer and the second sintered layer can be formed in such a manner that the conductive paste films are formed on a surface of the sintered electronic component body and are fired. The covering ceramic layer can be formed in such a manner that the covering ceramic green sheet is provided on the peripheral sections of the first and second sintered layers after sintering and is fired. The first sintered layer, the second sintered layer, and the covering ceramic layer are preferably formed in such a manner that the conductive paste films and the covering ceramic green sheet are fired together with firing for obtaining the electronic component body as described above. Forming the first sintered layer, the second sintered layer, and the covering ceramic layer by co-firing is advantageous in streamlining manufacturing steps and in reducing manufacturing costs and enables the bond strength between the electronic component body and the first sintered layer and the bond strength between the electronic component body and the covering ceramic layer to be increased. In the case of forming the first sintered layer, the second sintered layer, and the covering ceramic layer by co-firing, the base ceramic layer, which is included in the electronic component body, preferably contains the low-temperature co-fired ceramic material as described above.

A constraint green sheet mainly containing a metal oxide ($Al_2O_3$ or the like) not substantially sintered at the sintering temperature of the unsintered multilayer body 100 is prepared. The unsintered multilayer body 100 may be fired in such a state that the constraint green sheet is placed on a surface of the unsintered multilayer body 100. In this case, the constraint green sheet is not substantially sintered during firing, therefore does not shrink, and acts to suppress the shrinkage of the multilayer body in the principal surface direction.

After the unsintered multilayer body 100 is fired, the plating layer 23 is formed on the upper surface of the second sintered layer 22 by electroplating or electroless plating as shown in FIG. 2C. For the plating layer 23, it is preferable that a Ni plating film is formed on the second sintered layer 22 and an Au or Sn plating film is formed thereon. The above allows the ceramic electronic component 1, in which the surface electrode 20 including the first sintered layer 21, the second sintered layer 22, and the plating layer 23 is placed on a surface of the electronic component body 10 and the covering ceramic layer 30 covers the peripheral section of the surface electrode 20, to be obtained.

In the first embodiment of the present invention, forming the openings in the peripheral section of the surface electrode that is covered by the covering ceramic layer probably allows the liquid phase to be supplied to the covering ceramic layer from the base ceramic layer through the openings. As a result, the sinterability of the covering ceramic layer on the surface electrode is increased and the bond strength between the covering ceramic layer and the surface electrode is increased. Therefore, even in the case where the ceramic electronic component is subjected to a surface treatment such as blasting, the covering ceramic layer is unlikely to be peeled from the surface electrode.

Furthermore, forming the openings in the peripheral section of the surface electrode increases the contact area between the covering ceramic layer and the surface electrode, therefore enhances an anchoring effect, and increases the bond strength between the covering ceramic layer and the surface electrode.

Second Embodiment

Figure 3:
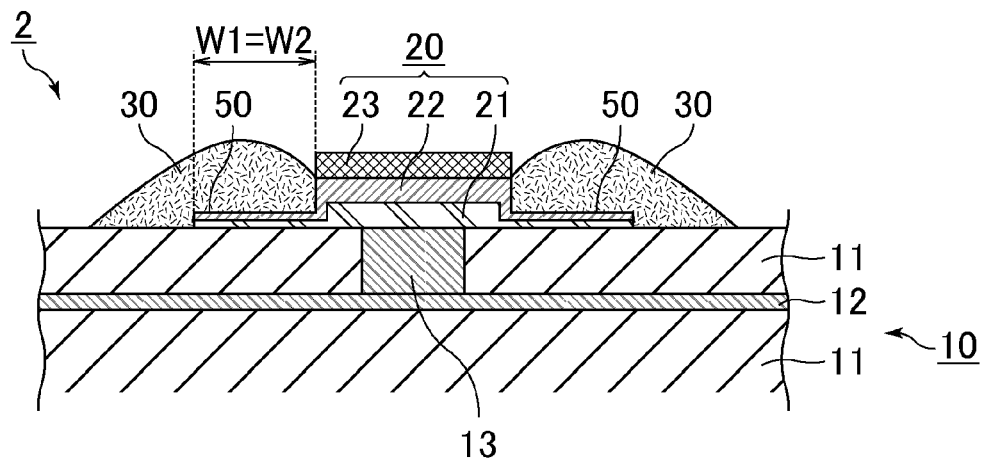
FIG. 3 is a schematic sectional view of an example of a ceramic electronic component according to a second embodiment of the present invention.

FIG. 3 is a schematic sectional view of an example of a ceramic electronic component according to a second embodiment of the present invention.

The ceramic electronic component 2, of which the overall configuration is not shown in FIG. 3, includes an electronic component body 10 including a superficial base ceramic layer 11, a surface electrode 20 placed on a surface of the electronic component body 10, and a covering ceramic layer 30 covering a peripheral section of the surface electrode 20.

The peripheral section of the surface electrode 20 that is covered by the covering ceramic layer 30 has a thin portion 50 which is present on the peripheral side of the surface electrode 20 and which is thinner than a central section of the surface electrode 20.

Referring to FIG. 3, the electronic component body 10 has a multilayer structure composed of a plurality of laminated base ceramic layers 11 and an inner conductive film 12 and via-hole conductor 13 serving as inner wiring conductors are placed in the electronic component body 10. The inner conductive film 12 is electrically connected to the via-hole conductor 13. The via-hole conductor 13 is electrically connected to the surface electrode 20. The surface electrode 20 has a three-layer structure and includes a first sintered layer 21 placed on the upper surface of the base ceramic layer 11 located at a surface of the electronic component body 10, a second sintered layer 22 placed on the upper surface of the first sintered layer 21, and a plating layer 23 placed on the upper surface of the second sintered layer 22.

As described above, in this specification, a section of a surface electrode that is covered by a covering ceramic layer is referred to as a peripheral section of the surface electrode and a section of the surface electrode that is not covered by the covering ceramic layer is referred to as a central section of the surface electrode.

As shown in FIG. 3, in the ceramic electronic component 2, the peripheral section of the surface electrode 20 is covered by the covering ceramic layer 30, which is placed on the base ceramic layer 11 and the second sintered layer 22. The whole of the peripheral section of the surface electrode 20 corresponds to the thin portion 50, which is thinner than the central section of the surface electrode 20. On the other hand, the central section of the surface electrode 20 is provided with the plating layer 23. The plating layer 23 is not covered by the covering ceramic layer 30.

Figure 4:
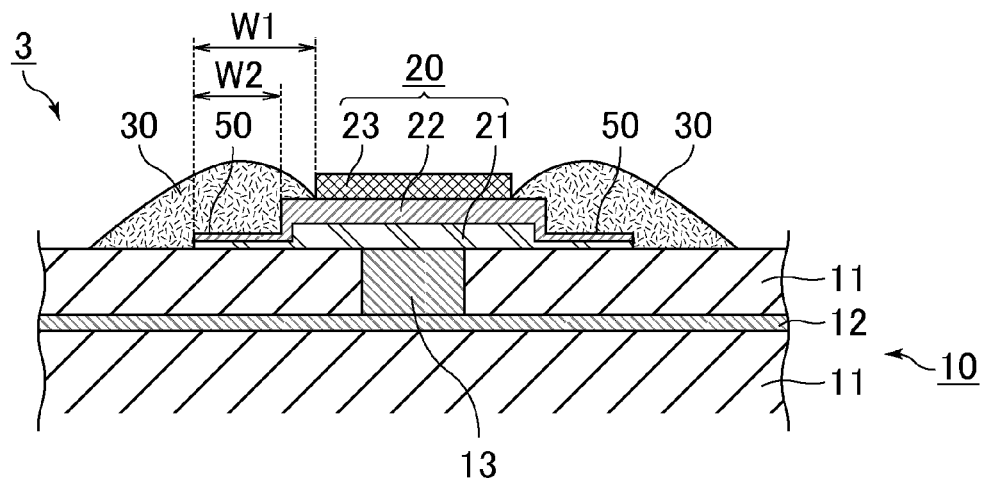
FIG. 4 is a schematic sectional view of another example of the ceramic electronic component according to the second embodiment of the present invention.

FIG. 4 is a schematic sectional view of another example of the ceramic electronic component according to the second embodiment of the present invention.

In a ceramic electronic component 3 shown in FIG. 4, a portion of a peripheral section of a surface electrode 20 is a thin portion 50 thinner than a central section of the surface electrode 20.

A material for the base ceramic layers, which are included in the electronic component body; a conductive component in inner wiring conductors placed in the electronic component body; and the like are the same as those described in the first embodiment.

The covering ceramic layer, which covers the peripheral section of the surface electrode, is placed on the base ceramic layer located at the surface of the electronic component body and the surface electrode.

A material contained in the covering ceramic layer, the thickness of the covering ceramic layer, and the like are the same as those described in the first embodiment.

The surface electrode, which is placed on a surface of the electronic component body, is one connected to another electronic component such as a wiring board or a mounted component. The surface electrode is connected to the other electronic component by soldering or the like.

A conductive component contained in the surface electrode is the same as that described in the first embodiment.

In the second embodiment of the present invention, the peripheral section of the surface electrode that is covered by the covering ceramic layer has the thin portion, which is present on the peripheral side of the surface electrode and is thinner than the central section of the surface electrode. In other words, in the second embodiment of the present invention, a thin portion having a predetermined width is present from the peripheral side to central side of the surface electrode, with the periphery of the surface electrode being an end portion on the peripheral side.

The width (the length represented by W1 in FIGS. 3 and 4) of the peripheral section of the surface electrode is not particularly limited and is preferably 15 μm to 1 mm.

As described above, in this specification the width of the peripheral section of the surface electrode refers to the distance from the periphery of the surface electrode to the inner edge of the covering ceramic layer.

The width (the length represented by W2 in FIGS. 3 and 4) of the thin portion is preferably 10 μm or more, more preferably 15 μm or more, and further more preferably 20 μm or more.

In the second embodiment of the present invention, the width of the thin portion refers to the distance from the periphery of the surface electrode to a portion having the same thickness as the thickness of the central section.

The width of the peripheral section of the surface electrode and the width of the thin portion can be both measured by cross-sectional observation using a scanning electron microscope (SEM).

In the second embodiment of the present invention, the width of the thin portion is preferably 50% or more of the width of the peripheral section of the surface electrode that is covered by the covering ceramic layer. That is, it is characteristic that the ratio (W2/W1) of the width W2 of the thin portion to the width W1 of the peripheral section of the surface electrode is 50% or more as shown in FIGS. 3 and 4. Referring to FIG. 3, for example, the width W2 of the thin portion is the same as the width W1 of the peripheral section of the surface electrode and therefore the width of the thin portion is 100% of the width of the peripheral section of the surface electrode.

The width of the thin portion is preferably 70% or more of the width of the peripheral section of the surface electrode that is covered by the covering ceramic layer, more preferably 90% or more, and particularly preferably 100%. The case where the ratio of the width of the thin portion is 100% corresponds to a third embodiment of the present invention.

The width of the thin portion may exceed 100% of the width of the peripheral section of the surface electrode that is covered by the covering ceramic layer. In this case, the central section of the surface electrode that is not covered by the covering ceramic layer has the thin portion. The central section of the surface electrode that is not covered by the covering ceramic layer may have the thin portion as described above. Only the peripheral section of the surface electrode preferably has the thin portion.

The thin portion preferably has a thickness of 10 µm or less and more preferably 5 µm or less.

The thickness of the thin portion can be measured by cross-sectional observation using a scanning electron microscope (SEM).

The thickness of the thin portion is preferably constant over the whole thin portion as shown in FIGS. 3 and 4. The thickness of the thin portion may decrease stepwise from the central section of the surface electrode toward the peripheral section thereof or may decrease continuously.

In the peripheral section of the surface electrode, the thin portion is preferably present over the whole of a region including the periphery of the surface electrode so as to surround the periphery of the surface electrode and a portion having the same thickness as the thickness of the central section may be present in a portion of the region including the periphery of the surface electrode. The peripheral section of the surface electrode may have a plurality of thin portions.

The surface electrode may have a single-layer structure or a multilayer structure and preferably has the multilayer structure.

When the surface electrode has the single-layer structure, the surface electrode is preferably composed of a sintered layer only.

When the surface electrode has the multilayer structure, the multilayer structure is preferably an at least two-layer structure including a sintered layer placed on the upper surface of the base ceramic layer located at the surface of the electronic component body and a plating layer placed on the upper surface of the sintered layer and is more preferably an at least three-layer structure including a first sintered layer placed on the upper surface of the base ceramic layer located at the surface of the electronic component body, a second sintered layer placed on the upper surface of the first sintered layer, and a plating layer placed on the upper surface of the second sintered layer.

The configurations of sintered layers such as the first sintered layer and the second sintered layer and the plating layer are the same as those described in the first embodiment and therefore are not described in detail.

Figure 5:
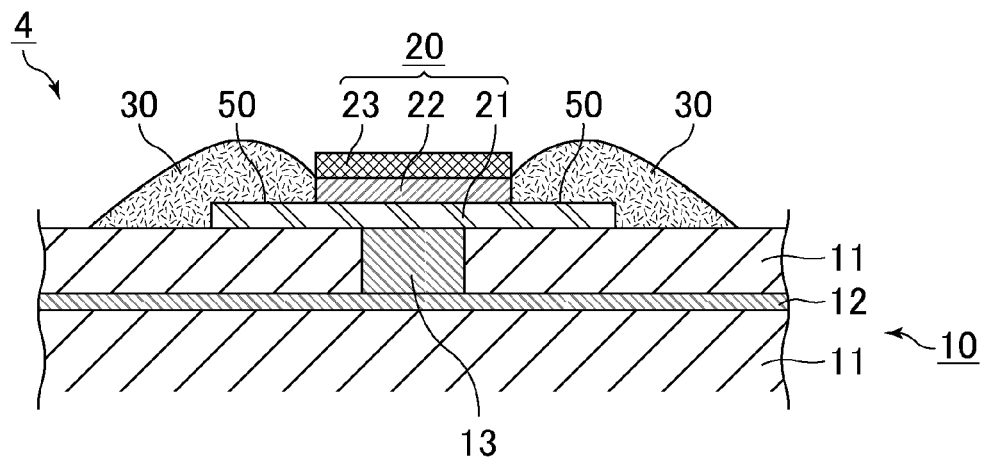
FIG. 5 is a schematic sectional view of another example of the ceramic electronic component according to the second embodiment of the present invention.

FIG. 5 is a schematic sectional view of another example of the ceramic electronic component according to the second embodiment of the present invention.

In a ceramic electronic component 4 shown in FIG. 5, a peripheral section of a first sintered layer 21 has an exposed surface on which no second sintered layer 22 or plating layer 23 is placed. The exposed surface is covered by a covering ceramic layer 30 placed on a base ceramic layer 11 located at a surface of an electronic component body 10 and the first sintered layer 21. Thus, the peripheral section of the first sintered layer 21 that is covered by the covering ceramic layer 30 is a thin portion 50 thinner than a central section of a surface electrode 20.

When the surface electrode has a multilayer structure as described above, the number of layers included in the thin portion may be different from the number of layers included in the surface electrode.

The ceramic electronic component 2 shown in FIG. 3 is preferably manufactured as described below.

Figure 6A:
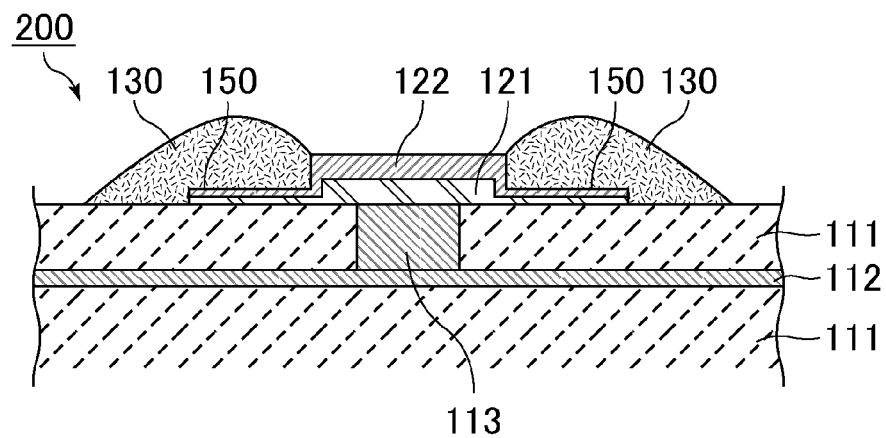
FIGS. 6A to 6C are schematic sectional views showing an example of a method for manufacturing the ceramic electronic component 2 shown in FIG. 3.
Figure 6B:
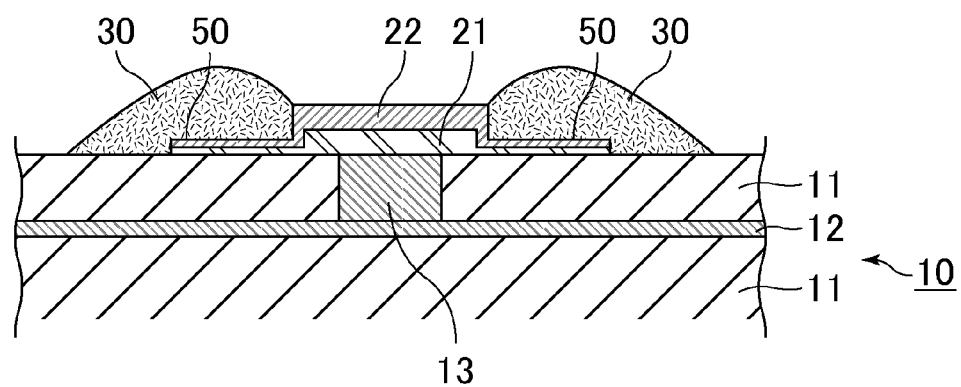
Figure 6C:
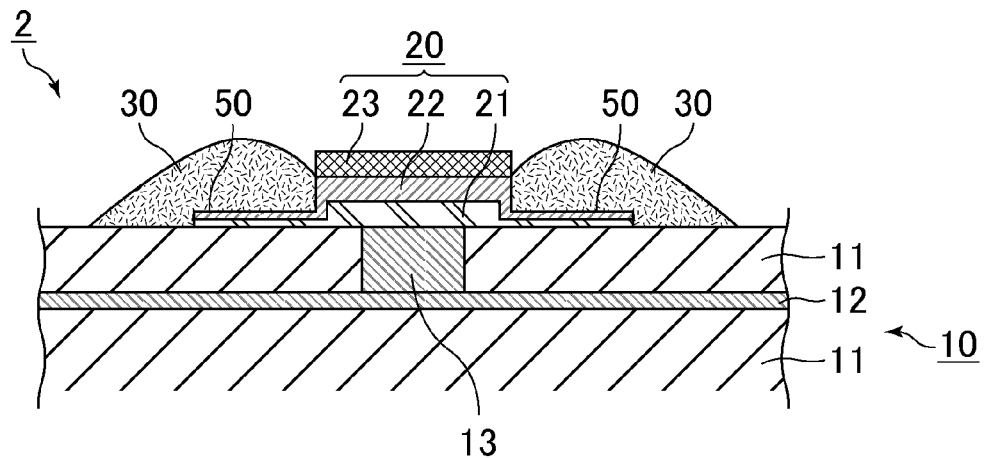

FIGS. 6A to 6C are schematic sectional views showing an example of a method for manufacturing the ceramic electronic component 2 shown in FIG. 3.

The manufacturing method shown in FIGS. 6A to 6C is the same as the manufacturing method shown in FIGS. 2A to 2C except a method for forming the surface electrode 20 and therefore common items are not described in detail.

First, an unsintered multilayer body 200 is prepared as shown in FIG. 6A.

In order to prepare the unsintered multilayer body 200, a plurality of base ceramic green sheets 111 are prepared and, thereafter, a conductive paste body 113 to be converted into the via-hole conductor 13 or a conductive paste film 112 to be converted into the inner conductive film 12 is formed on a specific one of the base ceramic green sheets 111 as is the case with the first embodiment. A covering ceramic green sheet 130 is separately prepared.

Furthermore, a conductive paste film 121 to be converted into the first sintered layer 21 is formed on the base ceramic green sheet 111 placed superficially after stacking and a conductive paste film 122 to be converted into the second sintered layer 22 is formed on the conductive paste film 121. In this operation, the conductive paste film 121 and the conductive paste film 122 are formed by varying the amount of an applied conductive paste such that a thin portion 150 in which a peripheral section is thinner than a central section is formed.

Subsequently, the unsintered multilayer body 200 is prepared by stacking and then pressure-bonding the base ceramic green sheet 111 provided with the conductive paste body 113 to be converted into the via-hole conductor 13 or the conductive paste film 112 to be converted into the inner conductive film 12, the base ceramic green sheet 111 provided with the conductive paste film 121 to be converted into the first sintered layer 21 and the conductive paste film 122 to be converted into the second sintered layer 22, and the covering ceramic green sheet 130. The covering ceramic green sheet 130 is provided on the base ceramic green sheet 111 placed superficially after stacking and the conductive paste film 122 to be converted into the second sintered layer 22 so as to cover peripheral sections of the conductive paste films 121 and 122 that have a reduced thickness.

Thereafter, the unsintered multilayer body 200 is fired. This allows the following body to be obtained as shown in FIG. 6B: a multilayer body including the electronic component body 10, which includes the superficial base ceramic layer 11; the first sintered layer 21, which is placed on the upper surface of the base ceramic layer 11; the second sintered layer 22, which is placed on the upper surface of the first sintered layer 21; and the covering ceramic layer 30, which is placed on the base ceramic layer 11 and the second sintered layer 22. Peripheral sections of the first and second sintered layers 21 and 22 that are covered by the covering ceramic layer 30 are provided with the thin portion 50.

After the unsintered multilayer body 200 is fired, the plating layer 23 is formed on the upper surface of the second sintered layer 22 by electroplating or electroless plating as shown in FIG. 6C. The above allows the ceramic electronic component 2, in which the surface electrode 20 including the first sintered layer 21, the second sintered layer 22, and the plating layer 23 is placed on a surface of the electronic component body 10 and the covering ceramic layer 30 covers the peripheral section of the surface electrode 20, to be obtained.

In the second embodiment of the present invention, in the peripheral section of the surface electrode that is covered by the covering ceramic layer, forming the thin portion, which is thinner than the central section of the surface electrode, on the peripheral side of the surface electrode and adjusting the width of the thin portion to 50% or more of the width of the peripheral section of the surface electrode probably allows a liquid phase to be supplied to the covering ceramic layer from the base ceramic layer through the thin portion. As a result, the sinterability of the covering ceramic layer on the surface electrode is increased and the bond strength between the covering ceramic layer and the surface electrode is increased. Therefore, even in the case where the ceramic electronic component is subjected to a surface treatment such as blasting, the covering ceramic layer is unlikely to be peeled from the surface electrode.

Third Embodiment

Figure 7:
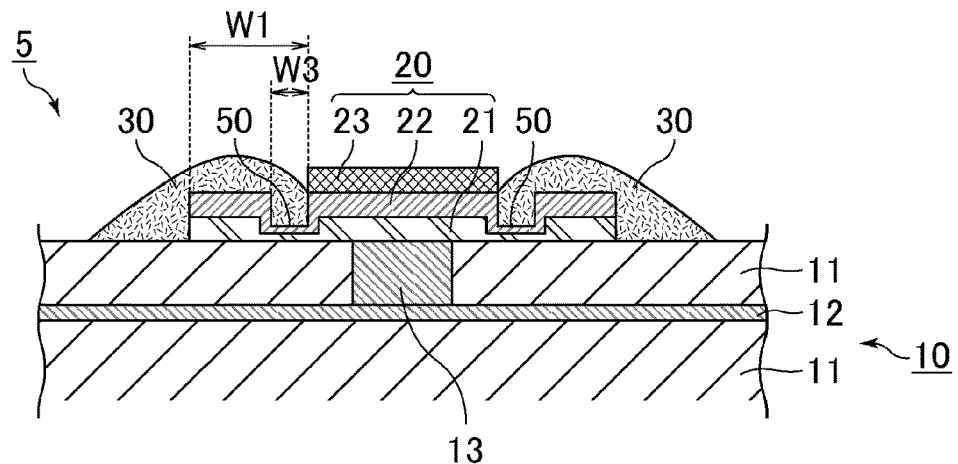
FIG. 7 is a schematic sectional view of an example of a ceramic electronic component according to a third embodiment of the present invention.

FIG. 7 is a schematic sectional view of an example of a ceramic electronic component according to the third embodiment of the present invention.

The ceramic electronic component 5, of which the overall configuration is not shown in FIG. 7, includes an electronic component body 10 including a superficial base ceramic layer 11, a surface electrode 20 placed on a surface of the electronic component body 10, and a covering ceramic layer 30 covering a peripheral section of the surface electrode 20.

The peripheral section of the surface electrode 20 that is covered by the covering ceramic layer 30 has a thin portion 50 which is present on the central side of the surface electrode 20 and which is thinner than a central section of the surface electrode 20.

In the third embodiment of the present invention, the peripheral section of the surface electrode that is covered by the covering ceramic layer has the thin portion, which is present on the central side of the surface electrode and is thinner than the central section of the surface electrode. In other words, in the third embodiment of the present invention, a thin portion having a predetermined width is present from the central side to peripheral side of the surface electrode. As shown in FIG. 7, an end of the thin portion that is located on the central side of the surface electrode preferably coincides with the position of the inner edge of the covering ceramic layer.

In the peripheral section of the surface electrode, the thickness of a portion other than the thin portion is preferably the same as the thickness of the central section of the surface electrode.

The width (the length represented by W1 in FIG. 7) of the peripheral section of the surface electrode is not particularly limited and is preferably 15 µm to 1 mm.

The width (the length represented by W3 in FIG. 7) of the thin portion is preferably 10 µm or more, more preferably 15 µm or more, and further more preferably 20 µm or more.

In the third embodiment of the present invention, the width of the thin portion refers to the distance from an end portion (preferably the inner edge of the covering ceramic layer) on the center side of the surface electrode to a portion which is located on the peripheral side of the surface electrode and which has the same thickness as the thickness of the central section.

In the third embodiment of the present invention, it is characteristic that the width of the thin portion is 20% or more of the width of the peripheral section of the surface electrode that is covered by the covering ceramic layer. That is, it is characteristic that the ratio (W3/W1) of the width W3 of the thin portion to the width W1 of the peripheral section of the surface electrode is 20% or more as shown in FIG. 7.

The width of the thin portion is preferably 50% or more of the width of the peripheral section of the surface electrode that is covered by the covering ceramic layer, more preferably 70% or more, further more preferably 90% or more, and particularly preferably 100%. The case where the ratio of the width of the thin portion is 100% corresponds to the second embodiment of the present invention.

The central section of the surface electrode that is not covered by the covering ceramic layer may have the thin portion. Only the peripheral section of the surface electrode preferably has the thin portion.

The thickness of the thin portion is preferably 10 µm or less and more preferably 5 µm or less.

As described above, in the third embodiment of the present invention, a position where the thin portion is present and the width of the thin portion are different from those described in the second embodiment. Other constituents of the ceramic electronic component are the same as those described in the second embodiment.

In the third embodiment of the present invention, in the peripheral section of the surface electrode that is covered by the covering ceramic layer, forming the thin portion, which is thinner than the central section of the surface electrode, on the central side of the surface electrode and adjusting the width of the thin portion to 20% or more of the width of the peripheral section of the surface electrode probably allows a liquid phase to be supplied to the covering ceramic layer from the base ceramic layer through the thin portion as is the case with the second embodiment. In particular, in the third embodiment, the liquid phase is probably likely to be supplied to an end portion of the covering ceramic layer that is most likely to be peeled off as compared to the second embodiment. As a result, the sinterability of the covering ceramic layer on the surface electrode is increased and the bond strength between the covering ceramic layer and the surface electrode is increased. Therefore, even in the case where the ceramic electronic component is subjected to a surface treatment such as blasting, the covering ceramic layer is unlikely to be peeled from the surface electrode.

EXAMPLES

Examples disclosing a ceramic electronic component according to the present invention in detail are described below. The present invention is not limited to the examples only.

[Confirmation of Effect Due to Openings]

The following components were prepared by the method described in the first embodiment: ceramic electronic components 1-1 to 1-4 each including a surface electrode placed on a surface of a base ceramic layer and a covering ceramic layer covering a peripheral section of the surface electrode, the peripheral section of the surface electrode that was covered by the covering ceramic layer having openings.

Figure 8:
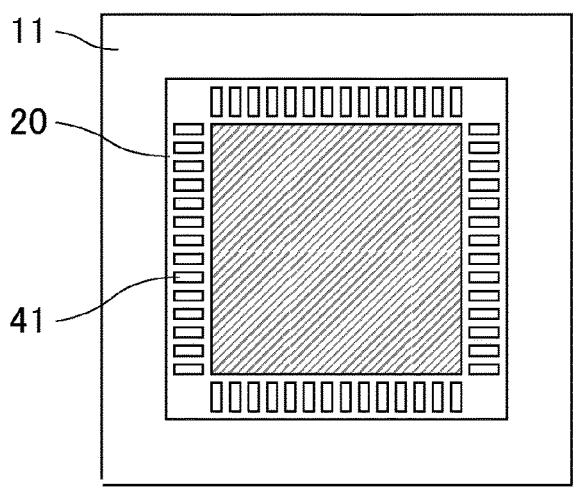
FIG. 8 is a schematic plan view showing the shape of openings formed in a peripheral section of a surface electrode in a ceramic electronic component 1-1.

FIG. 8 is a schematic plan view showing the shape of openings formed in the peripheral section of the surface electrode in the ceramic electronic component 1-1.

In the ceramic electronic component 1-1, the surface electrode 20 was formed on the base ceramic layer 11 by screen printing using a screen mask having gaps, placed at intervals of 0.05 mm, having a width of 0.05 mm such that a plurality of slits 41 with a size of 2 mm square were provided in the peripheral section, which was located 0.1 mm inside the periphery.

Figure 9:
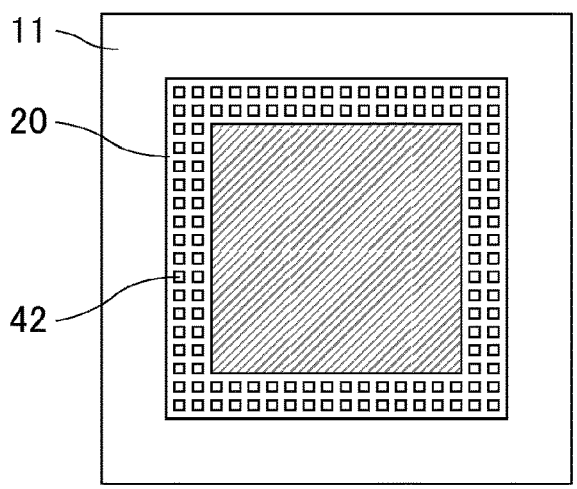
FIG. 9 is a schematic plan view showing the shape of openings formed in a peripheral section of a surface electrode in a ceramic electronic component 1-2.

FIG. 9 is a schematic plan view showing the shape of openings formed in the peripheral section of the surface electrode in the ceramic electronic component 1-2.

In the ceramic electronic component 1-2, the surface electrode 20 was formed on the base ceramic layer 11 by screen printing using a screen mask having 0.02 mm square holes placed at intervals of 0.02 mm such that a plurality of holes 42 with a size of 2 mm square were provided in the peripheral section, which was located 0.1 mm inside the periphery.

In the ceramic electronic component 1-3, after an electrode with a size of 2 mm square was formed, a laser was applied to the electrode so as to penetrate the electrode only, whereby the surface electrode was formed on the base ceramic layer so as to have holes, having a diameter of 0.015 mm, placed at intervals of 0.015 mm in the peripheral section 0.1 mm inside the periphery.

In the ceramic electronic component 1-4, the surface electrode was formed on the base ceramic layer in such a manner that after an electrode with a size of 2 mm square was formed on a PET film and holes with a diameter of 0.01 mm were formed at intervals of 0.01 mm in a peripheral section located 0.1 mm inside the periphery of the electrode, using a puncher, the electrode provided with the holes was transferred to a base ceramic green sheet such that a plurality of holes were provided in the peripheral section.

A ceramic electronic component 1-5 including a surface electrode including a peripheral section having no opening was prepared separately from the ceramic electronic components 1-1 to 1-4.

The ceramic electronic components 1-1 to 1-5 were blasted for the purpose of removing surface stains. After blasting, ten pieces of each ceramic electronic component were cross-sectionally polished and whether delamination occurred at the interface between a covering ceramic layer and a surface electrode was checked, whereby the bond strength between the covering ceramic layer and the surface electrode was evaluated.

For the bond strength between the covering ceramic layer and the surface electrode, one in which no delamination occurred at the interface between a covering ceramic layer and a surface electrode was rated A (excellent), one in which delamination occurred in one to less than nine pieces was rated B (good), and one in which delamination occurred in all ten pieces was rated C (poor). The results are shown in Table 1.

TABLE 1

| No. | Method for forming openings | Bond strength between covering ceramic layer and surface electrode |
|---|---|---|
| 1-1 | Slits formed by printing | A |
| 1-2 | Holes formed by printing | A |
| 1-3 | Holes formed with laser | A |
| 1-4 | Holes formed with puncher | A |
| 1-5* | No openings | C |

In Table 1, the ceramic electronic component 1-5, which is asterisked, is outside the scope of the present invention.

As is confirmed from Table 1, in the ceramic electronic component 1-5, in which the peripheral section of the surface electrode has no openings, delamination occurred at the interface between the covering ceramic layer and the surface electrode, whereas in the ceramic electronic components 1-1 to 1-4, in which the peripheral section of the surface electrode has openings (slits or holes), no delamination occurred at the interface between the covering ceramic layer and the surface electrode and the bond strength between the covering ceramic layer and the surface electrode is high. In the ceramic electronic components 1-1 to 1-4, the openings after firing were filled with a liquid phase supplied from the base ceramic layer.

From the about results, it is conceivable that forming openings in a peripheral section of a surface electrode allows a liquid phase to be supplied from a base ceramic layer to a covering ceramic layer through the openings, thereby increasing the bond strength between the covering ceramic layer and the surface electrode.

[Confirmation of Effect Due to Thin Portion]

The following components were prepared by the method described in the second embodiment: ceramic electronic components 2-1 to 2-4 each including a surface electrode placed on a surface of a base ceramic layer and a covering ceramic layer covering a peripheral section of the surface electrode, the peripheral section of the surface electrode that was covered by the covering ceramic layer having a thin portion.

In the ceramic electronic components 2-1 to 2-4, the width of the thin portion was fixed to 100% of the width of the surface electrode and the thickness of the thin portion was varied over values shown in Table 2.

The ceramic electronic components 2-1 to 2-4 were evaluated for the bond strength between the covering ceramic layer and the surface electrode by substantially the same method as the above. The results are shown in Table 2.

TABLE 2

| No. | Thickness of thin portion [μm] | Bond strength between covering ceramic layer and surface electrode |
|---|---|---|
| 2-1 | 20 | B |
| 2-2 | 15 | B |
| 2-3 | 10 | A |
| 2-4 | 5 | A |

As is confirmed from Table 2, in the ceramic electronic components 2-1 to 2-4, in which the peripheral section of the surface electrode has the thin portion, delamination can be prevented from occurring at the interface between the covering ceramic layer and the surface electrode. In particular, in the ceramic electronic components 2-3 and 2-4, in which the thickness of the thin portion is 10 μm or less, no delamination occurred at the interface between the covering ceramic layer and the surface electrode and the bond strength between the covering ceramic layer and the surface electrode is high.

From the about results, it is conceivable that forming a thin portion in a peripheral section of a surface electrode allows a liquid phase to be supplied from a base ceramic layer to a covering ceramic layer through the thin portion, thereby increasing the bond strength between the covering ceramic layer and the surface electrode.

REFERENCE SIGNS LIST 1, 2, 3, 4, 5 Ceramic electronic component
10 Electronic component body
11 Base ceramic layers
20 Surface electrode
21 First sintered layer
22 Second sintered layer
23 Plating layer
30 Covering ceramic layer
40 Openings
41 Slits
42 Holes
50 Thin portion
W1 Width of peripheral section of surface electrode
W2, W3 Width of thin portion

The invention claimed is:

1. A ceramic electronic component comprising:
an electronic component body including a superficial base ceramic layer;
a surface electrode on a surface of the electronic component body, wherein the surface electrode includes a first sintered layer on the superficial base ceramic layer, and a second sintered layer on the first sintered layer; and
a covering ceramic layer covering a respective peripheral section of the first sintered layer and the second sintered layer of the surface electrode,
wherein each of the respective peripheral section of the first sintered layer and the second sintered layer of the surface electrode that is covered by the covering ceramic layer has a thin portion:
wherein the thin portion of each of the first sintered layer and the second sintered layer is thinner than a respective central section of the first sintered layer and the second sintered layer of the surface electrode, and
wherein a width of the thin portion is 50% or more of a width of the respective peripheral section of the first sintered layer and the second sintered layer of the surface electrode that is covered by the covering ceramic layer.

2. The ceramic electronic component according to claim 1, wherein the width of the thin portion of each of the first sintered layer and the second sintered layer of the surface electrode is 15 µm or more.

3. The ceramic electronic component according to claim 1, wherein a total thickness of the thin portion of the first sintered layer and the second sintered layer of the surface electrode is 10 µm or less.

4. The ceramic electronic component according to claim 1, wherein the surface electrode further includes a plating layer on the second sintered layer.

5. The ceramic electronic component according to claim 4, wherein the first sintered layer contains a metal oxide containing at least one metal element selected from Al, Zr, Ti, Si, and Mg.

6. The ceramic electronic component according to claim 5, wherein the second sintered layer contains the metal oxide in an amount smaller than that contained in the first sintered layer.

7. The ceramic electronic component according to claim 4, wherein the plating layer is not covered by the covering ceramic layer.

8. A ceramic electronic component comprising:
an electronic component body including a superficial base ceramic layer;
a surface electrode on a surface of the electronic component body, wherein the surface electrode includes a first sintered layer on the superficial base ceramic layer, and a second sintered layer on the first sintered layer; and
a covering ceramic layer covering a respective peripheral section of the first sintered layer and the second sintered layer of the surface electrode,
wherein each of the respective peripheral section of the first sintered layer and the second sintered layer of the surface electrode that is covered by the covering ceramic layer has a thin portion adjacent to a respective central section of the first sintered layer and the second sintered layer of the surface electrode:
wherein the thin portion of each of the first sintered layer and the second sintered layer is thinner than the respective central section of the first sintered layer and the second sintered layer of the surface electrode, and
wherein a width of the thin portion is 20% or more of a width of the respective peripheral section of the first sintered layer and the second sintered layer of the surface electrode that is covered by the covering ceramic layer.

9. The ceramic electronic component according to claim 8, wherein the width of the thin portion of each of the first sintered layer and the second sintered layer of the surface electrode is 15 µm or more.

10. The ceramic electronic component according to claim 8, wherein a total thickness of the thin portion of the first sintered layer and the second sintered layer of the surface electrode is 10 µm or less.

11. The ceramic electronic component according to claim 8, wherein the surface electrode further includes a plating layer on the second sintered layer.

12. The ceramic electronic component according to claim 11, wherein the first sintered layer contains a metal oxide containing at least one metal element selected from Al, Zr, Ti, Si, and Mg.

13. The ceramic electronic component according to claim 12, wherein the second sintered layer contains the metal oxide in an amount smaller than that contained in the first sintered layer.

14. The ceramic electronic component according to claim 10, wherein the plating layer is not covered by the covering ceramic layer.

* * * * *